United States Patent [19]
Nakayama et al.

[11] Patent Number: 5,682,402
[45] Date of Patent: Oct. 28, 1997

[54] ORGANIC LUMINESCENT DEVICES WITH A MULTIPLEX STRUCTURE

[75] Inventors: Takahiro Nakayama, Hitachi; Atsushi Kakuta, Hitachiohta, both of Japan

[73] Assignee: Hitachi, Ltd., Tokyo, Japan

[21] Appl. No.: 584,473

[22] Filed: Jan. 11, 1996

[30] Foreign Application Priority Data

Jan. 10, 1995 [JP] Japan ................... 7-001708

[51] Int. Cl.⁶ ............................................. H01S 3/08
[52] U.S. Cl. ................... 372/99; 372/92; 372/7; 372/50; 372/39
[58] Field of Search ................ 372/39, 69, 44, 372/50, 7, 45; 359/42, 92

[56] References Cited

U.S. PATENT DOCUMENTS

| | | | |
|---|---|---|---|
| 5,307,186 | 4/1994 | Izumi et al. | 359/42 |
| 5,369,657 | 11/1994 | Cho et al. | 372/69 |
| 5,384,795 | 1/1995 | Cho et al. | 372/69 |

*Primary Examiner*—Leon Scott, Jr.
*Attorney, Agent, or Firm*—Antonelli, Terry, Stout & Kraus, LLP.

[57] ABSTRACT

A first half-mirror, a buffer layer, a second half-mirror, a transparent electrode, an organic luminescent layer and a metal electrode which also serves as a reflector are formed on a transparent substrate thereby to constitute a first resonator between the second half-mirror and the metal electrode and a second resonator between the first half-mirror and the metal electrode. Light output of a desired wavelength is obtained from the light emitted from the organic luminescent layer utilizing resonance characteristics of the first and second resonators.

9 Claims, 6 Drawing Sheets

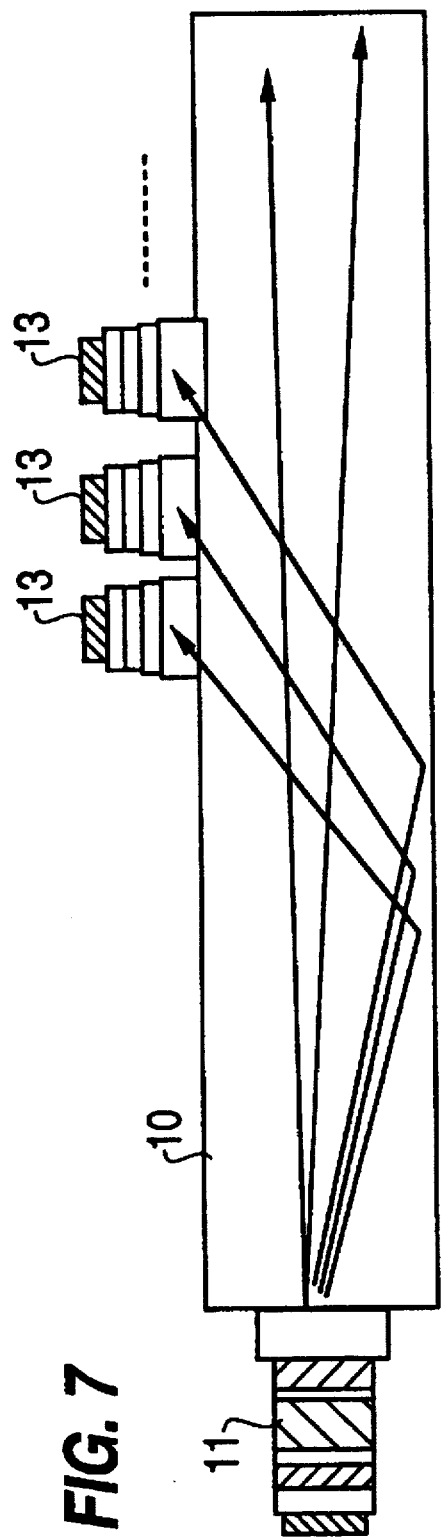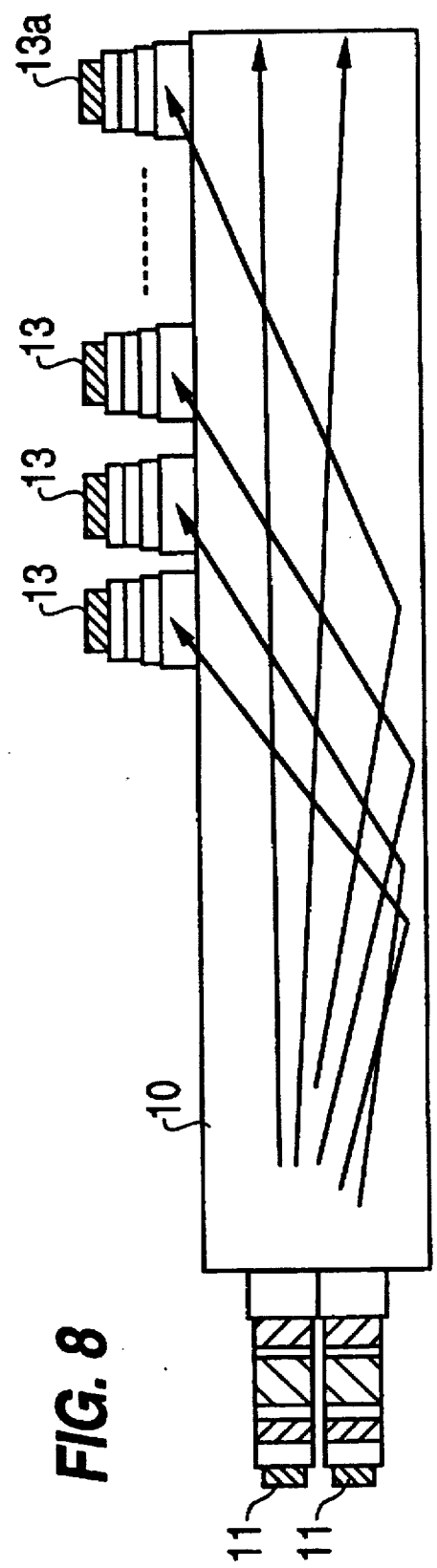

5,682,402

ORGANIC LUMINESCENT DEVICES WITH A MULTIPLEX STRUCTURE

BACKGROUND OF THE INVENTION

The present invention relates to a luminescent device and, particularly, to an organic luminescent device which is capable of producing a varying emission spectrum depending upon the object.

In a conventional organic luminescent device having a very small resonance structure, as disclosed in Nakayama et al, "Study of a Multi-Color Luminescent Device Using Organic Luminescent device Having a Very Small Resonance Structure", the Transaction of the Institute of Electronics, Information and Communication Engineers of Japan, C-II, Vol. J77-C-II, No. 10, October, 1994, pp. 437–443, a luminescent device is provided between two reflectors to cause resonance therebetween.

That is, the conventional luminescent device having a very small resonance structure has a half-mirror of a thin multilayer film on a substrate. Then, a transparent electrode composed of an ITO (indium-tin oxide film) is formed thereon. Moreover, a luminescent layer made of a triphenyldiamine derivative (TAD) and tris-(8-hydvoxy quindline) aluminum(ALQ) compound is formed thereon and an electrode of a thin metal film, which also serves as a reflector, is further formed thereon. With this constitution, the light emitted from the luminescent layer causes resonance between the electrode and the half-mirror, so that light having a particular wavelength only is emitted to the outer side from the half-mirror.

The conventional organic luminescent device having a very small resonance structure has an emission spectrum specific to the resonator. That is, resonance is brought about by selecting the length of addition of twice the effective optical distance between the reflectors and the wavelength by a phase shift occurring on the reflector surface, to be an integral multiple of the wavelength that is taken out. Therefore, the device must be designed to satisfy the above requirement.

In designing thin-film devices, in many cases, a limitation is imposed on the thickness of the film depending upon the function and structure of the device. In many liquid crystal devices reported so far, for example, the thickness of the film is of the order of microns, which is larger by about ten times than the wavelength of the light that is emitted.

Due to miss-matching between these requirements and the limitations, a sufficient length could not be provided in the resonator and the desired functions often could not be often realized.

SUMMARY OF THE INVENTION

The object of the present invention is to provide an organic luminescent device which is capable of emitting light having a desired spectrum, and a communication device and a display using the device, by solving the above-mentioned problems.

In order to accomplish the above-mentioned object according to the present invention, a first half-mirror layer is formed on a substrate, a transparent film of silicon oxide is formed thereon in such a way as to define a predetermined gap, a second half-mirror is formed thereon, an electrode of ITO is formed on the second half-mirror, a luminescent device layer is formed thereon and, then, an electrode of a thin metal film is formed thereon to also serve as a reflector.

In the case of a light-excited luminescent device, by providing an ITO electrode having a double resonance structure as mentioned above, a combination of characteristics of a plurality of resonators can be realized in a single device.

BRIEF DESCRIPTION OF THE DRAWINGS

FIG. 7 is a diagram illustrating an optical communication device using the organic EL device having a double resonance structure;

FIG. 8 is a diagram illustrating another optical communication device using the organic EL device having a double resonance structure.

DESCRIPTION OF THE PREFERRED EMBODIMENTS

First of all a principle of when a light-excited luminescent device is provided with a resonance function will be described.

Figure 2A:
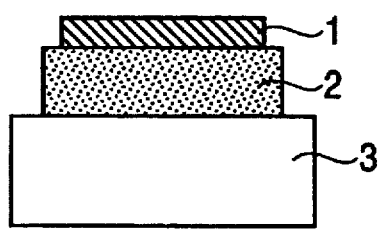
FIG. 2(a) is a sectional view of the light-excited luminescent device and FIG. 2(b) is a graph of the luminescent spectra obtained thereby.

FIG. 2(a) illustrates a conventional organic luminescent device having a light-exciting structure.

In this constitution, as shown in FIG. 2(a), a luminescent layer 2 of ALQ compound expressed by the following structural formula (1) is formed on a transparent glass substrate 3, and a thin metal layer 1 is formed thereon to form a reflector.

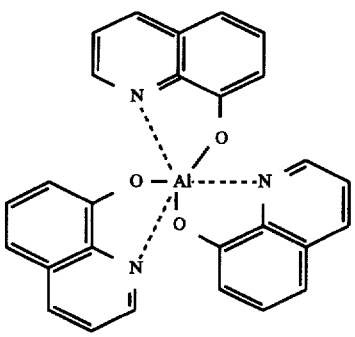

(1)

Figure 2B:
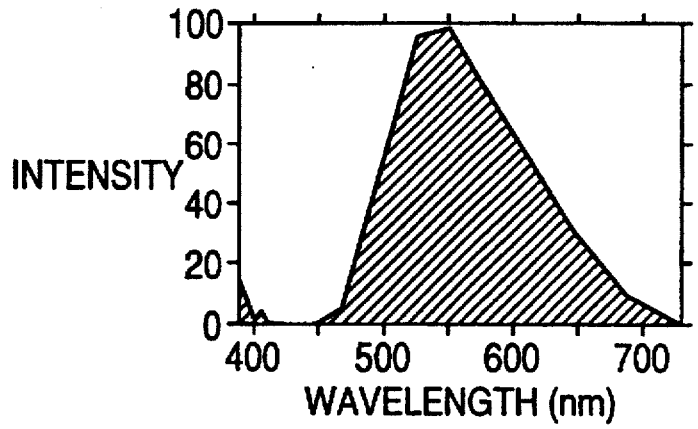

When this device is irradiated with light from an ultraviolet lamp, luminescent spectra are obtained as shown in FIG. 2(b).

Figure 3A:
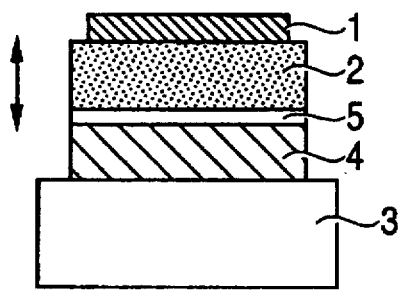
FIG. 3(a) is a sectional view of a light-excited luminescent device having a resonance structure.
Figure 3B:
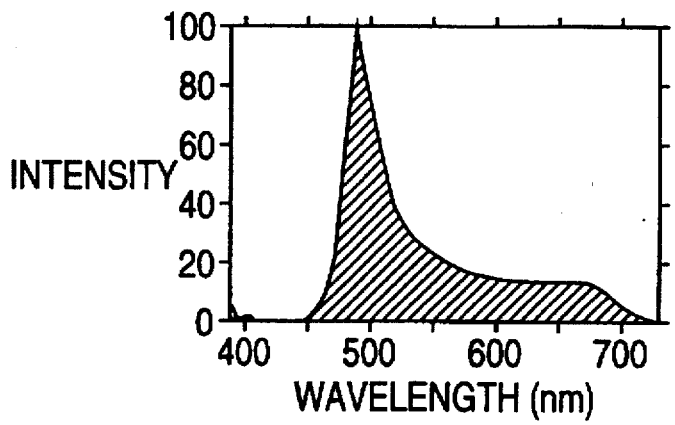
FIG. 3(b) is a graph of the luminescent spectra obtained thereby.

FIG. 3(a), illustrates a device of the constitution of FIG. 2(a) to which a resonance function is added, wherein a half-mirror 4 is formed between the glass substrate 3 and the luminescent layer 2 by forming thin films of a titanium oxide and a silicon oxide one upon the other. The device emits light of a wavelength of a characteristic close to the luminescent wavelength of the device Luminescent spectrum obtained by this constitution are shown in FIG. 3(b), from which the peak of luminescence is observed near the wavelength of 500 nm.

Figure 4A:
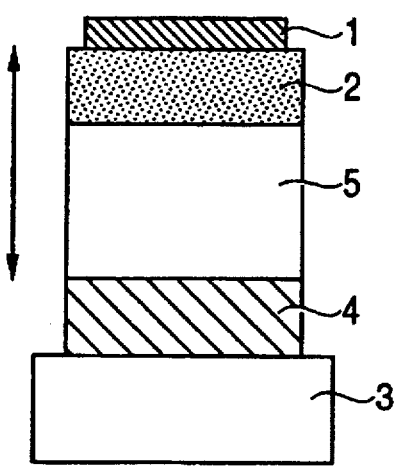
FIG. 4(a) is a sectional view illustrating another light-excited luminescent device having a resonance structure.

FIG. 4(a) illustrates a luminescent device having a very small resonance structure of FIG. 3(a) but in which a buffer layer 5 is additionally provided between the luminescent layer and the half-mirror. This buffer layer 5 makes it possible to obtain a resonator of a characteristic wavelength which is longer by about ten times than the luminescent wavelength.

Figure 4B:
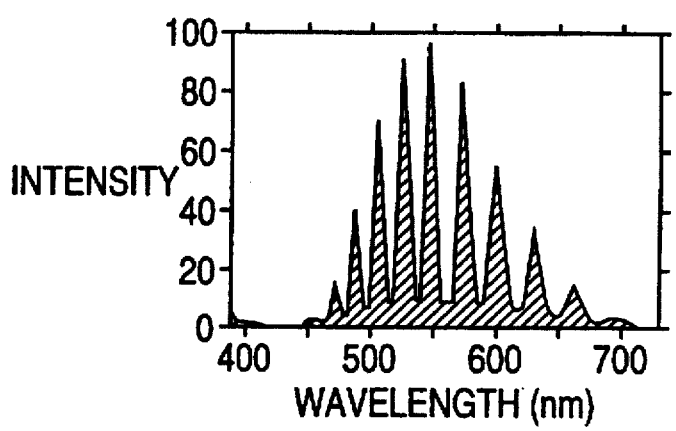
FIG. 4(b) is a graph of the luminescent spectra obtained thereby.

FIG. 4(b) shows luminescent spectrum of FIG. 4(a), in which a plurality of peaks are shown in the resonance region. This is due to the fact that the resonator has a long characteristic wavelength, causing intervals between the wavelengths satisfying the resonance conditions to become short. The envelope of peaks is close to the shape of the luminescent spectrum of FIG. 1(b).

Figure 1A:
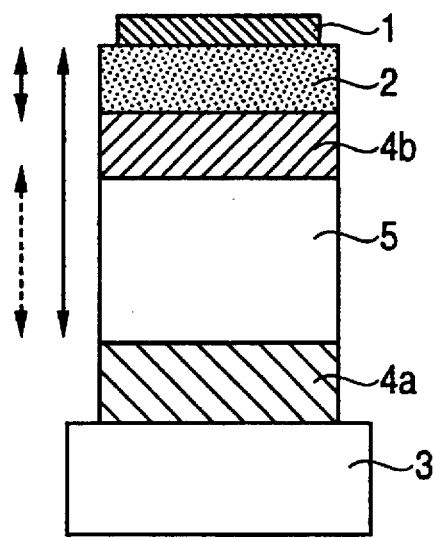
FIG. 1(a) is a sectional view of a light-excited luminescent device having a double resonance structure according to the present invention.

FIG. 1(a) illustrates an example of an organic luminescent device having a multiplex resonance function according to the present invention.

The constitution of FIG. 1(a) is such that the present invention is adapted to the light-excited luminescent device shown in FIG. 3(a).

Referring to FIG. 1(a), a first half-mirror 4a comprising five layers of titanium oxide TiO₂ (54 nm thick and silicon oxide SiO₂ (86 nm thick) is formed on the transparent glass substrate 1, and a transparent film of silicon oxide is formed thereon to a thickness of about 2 pm. Then, a second half-mirror 4b comprising four layers of TiO₂ (54 nm thick) and SiO2 (86 nm thick) is formed, on which is further formed, as a luminescent layer, a film of ALQ of the structural formula (1) which is a sublimated and purified product manufactured by Dojin Kagaku Co. to a thickness of 350 nm. There is further formed thereon a reflector of a thin metal film. In this device, the thin metal film is made of indium.

Figure 1B:
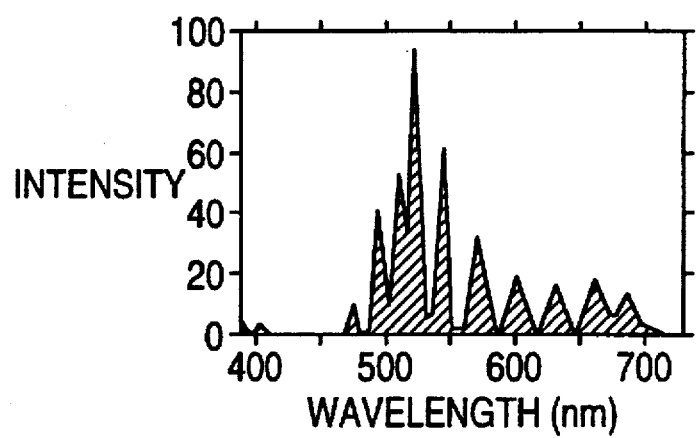
FIG. 1(b) is a graph of the luminescent spectra obtained thereby.

The thus constituted luminescent device was tested by using an ultraviolet lamp for causing luminescence, and the luminescent spectrum is shown in FIG. 1(b), in which a plurality of peaks are shown like those of the luminescent spectrum of FIG. 4(b). The envelope of these peaks are close to the shape of the luminescent spectrum of FIG. 3(c). That is, it is found that the device of this structure has the features of the two emission wavelengths of the structures of FIGS. 3(a) and 4(a).

By employing a double resonance structure as described above, it is possible to fabricate a device that has a combination of characteristics of a plurality of resonators.

Figure 5A:
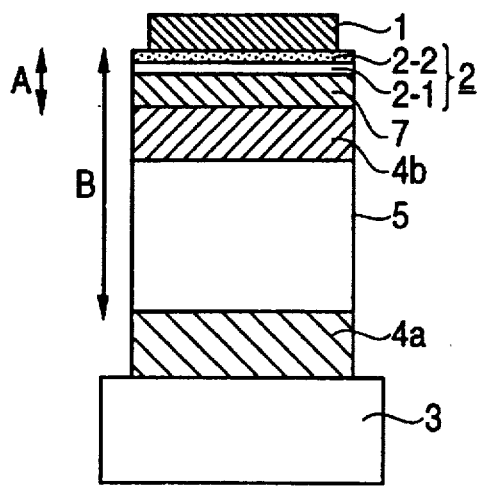
FIG. 5(a) is a sectional view of an organic EL device having a double resonance structure, FIG. 5(b-1) is a graph of the luminescent spectra obtained by a first resonator and FIG. 5(b-2) is a graph of the luminescent spectra obtained by a second resonator in the device of FIG. 5(a)

FIG. 5(a) illustrates another embodiment of the present invention, in the form of is a sectional view of the device obtained by applying a double resonance structure to an organic EL device.

In FIG. 5(a), TiO₂ layers (54 nm thick) and SiO₂ layers (86 nm thick) are formed in five layers on the glass substrate 3 to form a half-mirror 4a. On the half-mirror 4a is formed a transparent buffer layer 5 of silicon oxide of a thickness of 2 pm, on which is further formed a transparent electrode 7 of ITO. There is further formed thereon by vacuum evaporation a luminescent layer 2 comprising TAD layer 2-1 (50 nm thick) expressed by a structural formula (2) and the above-mentioned ALQ layer 2-2 (50 nm thick). On the luminescent layer 2 is formed a thin metal layer 1 of indium that serves as an electrode, and the luminescent side of this layer is used as a reflector surface.

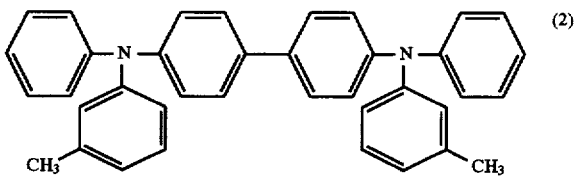

(2)

The method of producing the device will be described below.

(1) First, the glass substrate 3 is washed.
(2) Next, the TiO₂ layer and the SiO₂ layer are alternately formed by sputtering to form the half-mirror 4a.
(3) The buffer layer of silicon oxide (SiO₂) is formed by sputtering to a thickness of about 2 pm on the half-mirror 4a that is formed.
(4) Next, the TiO₂ layer and the SiO₂ layer are alternately formed by sputtering to form the half-mirror 4a in the same manner as in the step (2).
(5) Then, the ITO film is formed also by sputtering and is selectively removed by etching to form an electrode pattern.
(6) Thereafter, a thin film of the above-mentioned TAD is formed by vacuum evaporation on the above electrode.
(7) On the thin TAD film is formed a thin film of ALQ by vacuum evaporation.
(8) A predetermined mask pattern is formed on the ALQ film, and a thin indium film is formed thereon by vacuum evaporation.

In the above-mentioned steps, the sputtering is effected by using a sputtering gas of Ar+4% of O₂. The gas pressure is 1.3 Pa, the gas flow rate is 10 sccm, the substrate temperature is 40 (cooled with water), the speed of revolution of a sample holder is 4 rpm, the distance between the sample and the target is 50 mm, and the RF power is 2.6 W/cm for TiO₂ and 3.9 W/cm for SiO₂.

Figure 5C:
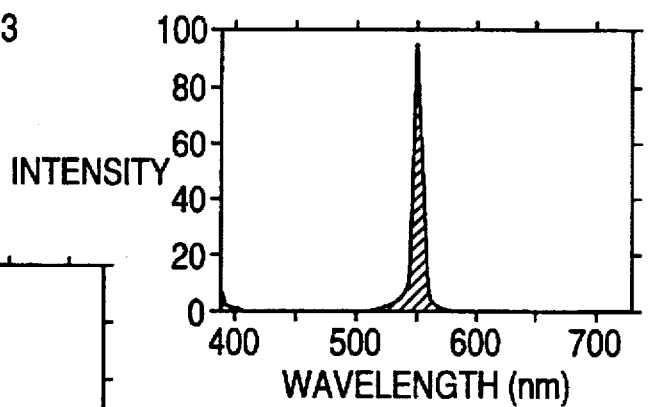
FIG. 5(c) is a graph of the combined luminescent spectra of FIGS. 5(b-1) and 5(b-2)
Figures 1, 5B:
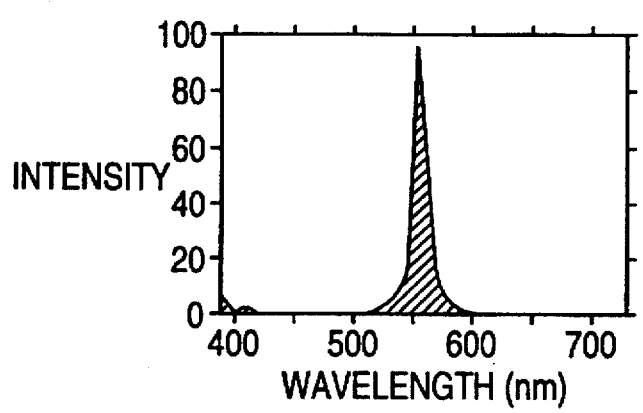
Figures 2, 5B:
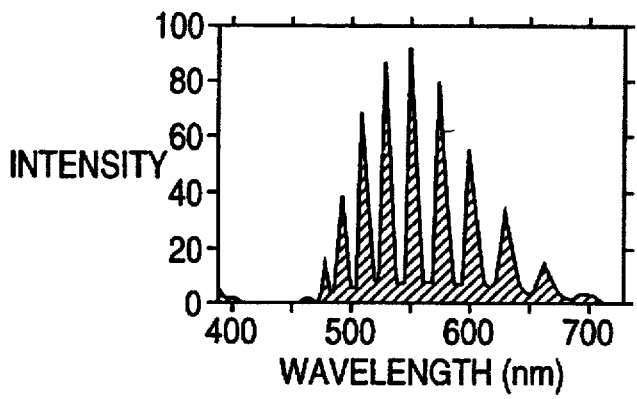

FIG. 5(c) illustrates the emission spectrum of the constitution of FIG. 5(a). Thus, it is possible to obtain light having a sharp peak near a wavelength of 550 nm. This light is obtained according to the principle described above with reference to FIGS. 2(a) to 4(a). That is, from the light emitted from the luminescent layer 2, light having emission spectrum of FIG. 5(b-1) is obtained by the first resonator A, and the light having emission spectrum of FIG. 5(b-2) is obtained by the resonator B. Emission spectrum of FIG. 5(c) are obtained by combining the above spectra.

By changing the thicknesses of the films according to the present invention, it is possible to obtain emission spectrum having any specific wavelengths. Thus, it is possible to provide a luminescent device with an increased degree of freedom of design.

In the above described embodiments, the a device is designed to emit light having a sharp peak in the direction perpendicular to the layers. The device, however, may be so designed that the light is emitted in an oblique direction with respect to the layers. In this case, the emission spectrum can be varied depending upon the angle of measurement from the front side according to whether or not the average refractive indexes of the first resonator A and the second resonator B are brought into agreement. Even in the embodiments, a similar luminescence could be confirmed even in an oblique direction.

The organic luminescent resonator can be so fabricated that the peak wavelength in the emission spectrum is nearly the same as the wavelength of luminescence, but has a margin in the thickness of the layers which is too small to incorporate a device having another function. Therefore, the effect of realizing a device having a combination of the functions of the two devices by use of the above structure is great.

It should be obvious that the organic luminescent device may have luminescent layers formed by using well-known organic luminescent materials in addition to the structure of the luminescent layers of the above embodiments. The devices also can be fabricated by coating other, rather than evaporation.

Moreover, the above-mentioned embodiments employ a total reflection mirror and two half-reflectors (half-mirrors) to realize a double resonance structure. Depending upon the objects, however, the number of half-mirrors may be increased to obtain a multiplex resonance structure.

Figure 6A:
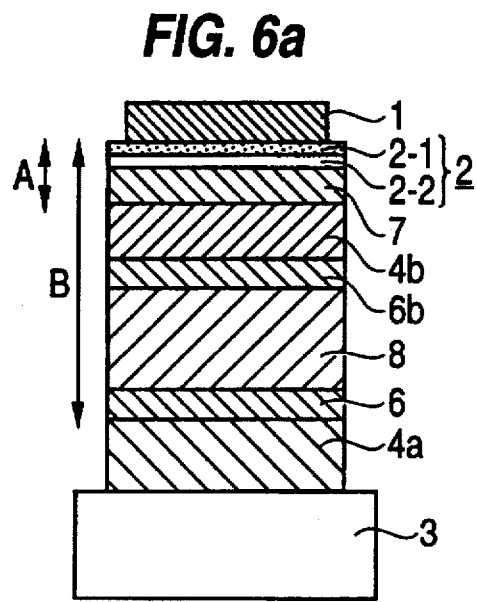
FIG. 6(a) is a sectional view of another organic EL device having a double resonance structure, and FIGS. 6(b-1) to 6(b-3) are graphs of the luminescent spectra produced by the device of FIG. 6(a) when the applied voltage is changed.
Figures 1, 6B:
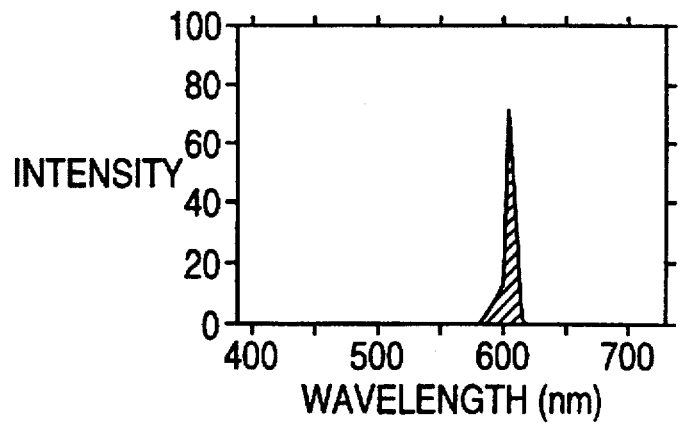
Figures 2, 6B:
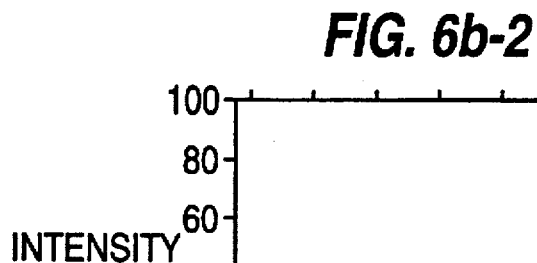
Figures 3, 6B:
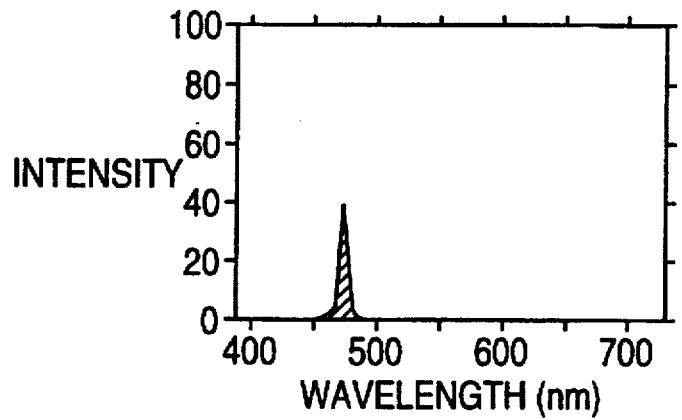

FIG. 6(a) is a sectional view of a luminescent device according to another embodiment of the present invention.

In this embodiment, provision is made of a transparent electrode layer 6a of ITO, a liquid crystal layer 8 of polymer dispersion type, and a transparent electrode layer 6b of ITO, instead of the transparent layer 5 of silicon oxide as used in the embodiment of FIG. 5(a). The refractive index is changed by controlling the voltage applied to the liquid crystal layer 8. According to this constitution, the optical distance is varied between the two half-mirrors.

FIGS. 6(b-1) to 6(b-3) illustrate emission spectra when the voltage applied to the liquid crystal layer 8 is changed.

FIG. 6(b-1) shows the emission spectrum when a predetermined voltage is applied. In this case, an emission peak occurs at a wavelength of 600 nm. As the applied voltage is raised, the emission peak will almost disappear, as shown in FIG. 6(b-2). The reason is because the emission wavelengths generated by the first resonator A and the second resonator B do not overlap one upon the other any longer, as if no light was emitted. As the characteristics of the resonator B change causing a further increase in the applied voltage, light of about 480 nm is emitted as shown in FIG. 6(b-3).

The field to which the device of the invention can be applied can be selected according to the emission peak by controlling the voltage.

In this embodiment, the apparent distance of the resonator is varied by providing the liquid crystal layer and the electrode layer for driving the liquid crystal layer. In addition to the above-mentioned constitution, however, it is also possible to employ electromagnetic waves, pressure, temperature or magnetic force to vary the apparent optical length.

Though the above-mentioned embodiment uses the transparent substrate 3, it is also possible to utilize the light of the surface opposite to the substrate by using a half-mirror for the thin metal layer 1, which is the uppermost layer. When the light in the lateral direction is to be utilized, there may be employed an opaque substrate. When the light in the lateral direction is utilized, it becomes essential that at least one of the three reflectors is a semi-transparent one.

As the semi-transparent reflector film, there can be used a dielectric multilayer film, a semitransparent metal film, or a total-reflection film having partly transmitting windows.

FIG. 7 illustrates an example in which the luminescent device of the present invention is applied to optical communication.

In FIG. 7, an organic luminescent device 11 that was described above as a light-emitting device is provided at an end of an optical waveguide 10, the data input from an external unit is subjected to A/D conversion and converted into light signals having different wavelengths depending upon the digital data that is converted, and the light signals are output to the optical waveguide. Light-receiving conversion devices 13 are provided along the optical waveguide or at the other end thereof to receive light signals transmitted through the waveguide. In FIG. 7, the light-receiving conversion devices 13 are so provided along the path of the waveguide as to receive light signals of different wavelengths. This constitution makes it possible to simultaneously transmit large amounts of communication data to different receivers.

FIG. 8 illustrates another example in which the luminescent devices of the present invention are applied to optical communication.

In this embodiment, the optical waveguide 10 is provided with a plurality of organic luminescent devices 11 for transmission to simultaneously emit a plurality of light signals having different wavelengths which are then received by a plurality of light-receiving conversion devices 13 provided along the path of the optical waveguide. Here, any one or all of the plurality of light-receiving conversion devices 13 may be light-receiving conversion devices made up of light-receiving devices capable of receiving light of all the wavelengths, so that all of the data can be transmitted to particular receivers.

Figure 9:
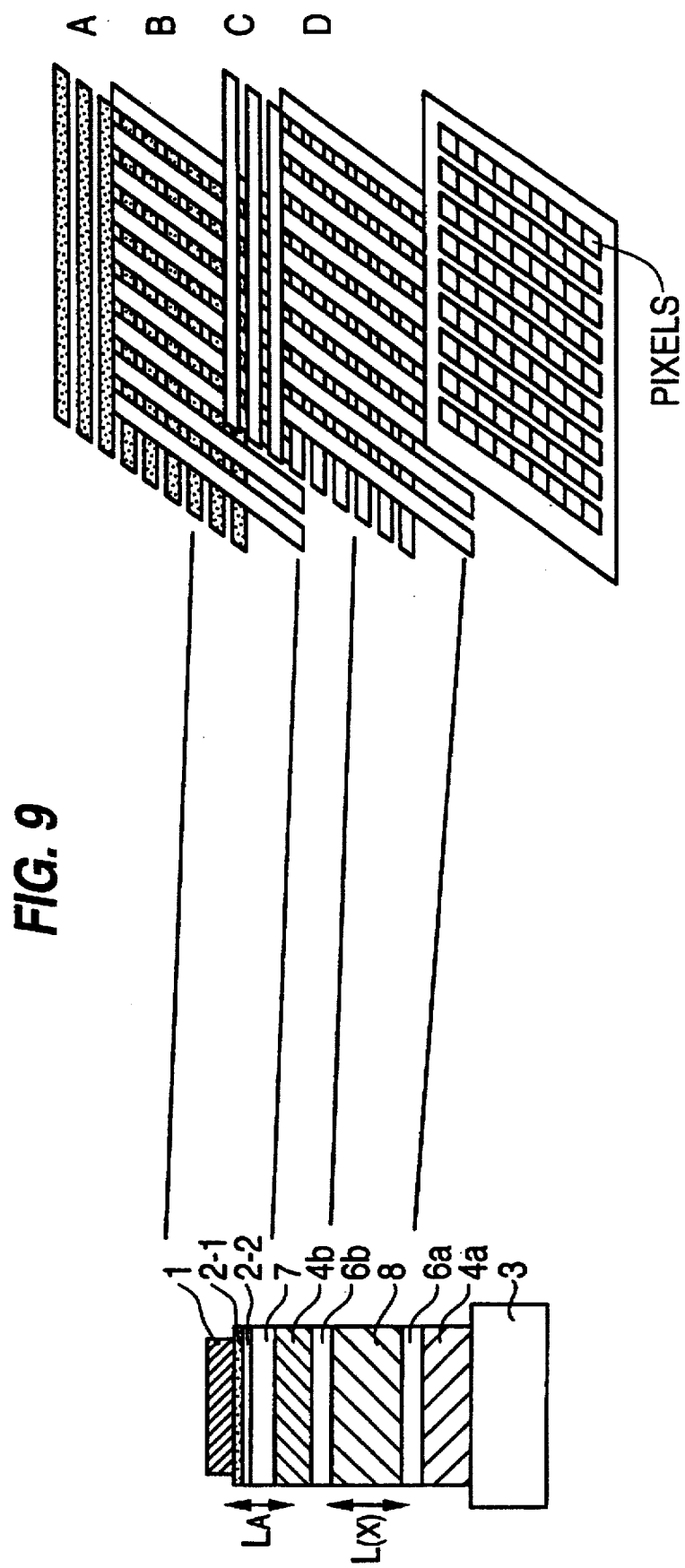
FIG. 9 is a diagram illustrating a display using the organic EL devices having a double resonance structure.

FIG. 9 illustrates an embodiment where the luminescent devices of the constitution shown in FIG. 6(a) are applied to a display panel.

The luminescent devices are arranged on the glass substrate in the form of a matrix in units of a pixel. As shown in FIG. 9, the half-mirrors 4a are disposed in the form of a matrix on the glass substrate 3, and transparent electrodes 6a are formed thereon for each column of pixels. Then, a liquid crystal layer is formed thereon to vary the optical length, and transparent electrodes 6b are formed thereon for each row of pixels. Half-mirrors 4b are superposed thereon, and transparent electrodes 7 of ITO are provided on the half-mirrors 4b for each column of pixels. A thin TAD film 2-2 and a thin ALQ film 2-1 are formed on the transparent electrodes 7 to constitute luminescent portions, and metal electrodes 1 are formed for each row of pixels. The surfaces of the metal electrodes in contact with the thin ALQ film 2-1 are so formed as to serve as total reflection surfaces.

The device of this constitution operates as described below.

A voltage is applied between the transparent electrodes 1 and 7 according to the image data to be displayed, so that luminescent devices of predetermined pixels emit light. The luminescent intensity at this moment can be varied in multiple gradations by controlling the voltage that is applied. As for the emission wavelength related to the color of emission, furthermore, the voltage applied between the transparent electrodes 6a and 6b is controlled to change the optical path length of light emitted by the luminescent devices between the half-mirrors 4a, 4b constituting the reflectors and the metal electrodes 1 which are the reflectors, in order to output light of a predetermined color and wavelength.

This makes it possible to eliminate color filters that have been so far necessary and to form a vivid image.

According to the present invention, a single luminescent device makes it possible to obtain an emission spectrum of a combination of characteristics of a plurality of luminescent devices. It is further possible to obtain characteristics such as angle dependence. Moreover, since the freedom of selecting the film thicknesses is ensured, it is possible to realize a device in which a separate function is added to the resonator. By employing the luminescent device for communication, furthermore, it is possible to simultaneously transmit a large quantity of data to different receivers. By applying the luminescent devices to a display for displaying an image, etc., furthermore, it is possible to form a vivid image by means of a simple control operation.

We claim:

1. An organic luminescent device with a multiplex structure, comprising: a light-excited luminescent device made up of a substrate, a first half-mirror layer overlying said substrate, an organic luminescent layer, overlying said first half-mirror layer, that emits light, and a reflector overlying said organic luminescent layer, wherein at least one of a buffer layer and a second half-mirror layer is formed between said first half-mirror layer and said organic luminescent layer such that resonators are formed between said reflector and said first half-mirror layer, and between said reflector and any second half-mirror layer.

2. An organic luminescent device with a multiplex structure, comprising: a luminescent device made up of a substrate, a first half-mirror layer overlying said substrate, an electrode layer overlying said first half-mirror layer, an organic luminescent layer, overlying said electrode layer, that emits light, and a metal layer, serving as both a reflector and an electrode, overlying said organic luminescent layer, wherein at least one of a buffer layer and a second half-mirror layer is formed between said first half-mirror layer and said organic luminescent layer such that resonators are formed between said reflector and said first half-mirror layer, and between said reflector and any second half-mirror layer.

3. An organic luminescent device with a multiplex structure, comprising: a substrate, a first half-mirror overlying said substrate, a transparent buffer layer overlying said first half-mirror, a second half-mirror overlying said buffer layer, an organic luminescent layer, that emits light when irradiated with light, overlying said second half-mirror, and a metal layer, serving as a reflector, overlying said organic luminescent layer, wherein a first resonator is provided between said reflector and said second half-mirror, and a second resonator is provided between said reflector and said first half-mirror.

4. An organic luminescent device with a multiplex structure, comprising: a substrate, a first half-mirror overlying said substrate, a transparent buffer layer overlying said first half-mirror, a second half-mirror overlying said transparent buffer layer, a transparent electrode overlying said second half-mirror, an organic luminescent layer, that emits light, overlying said transparent electrode, and a metal layer, serving as a reflector and an electrode, overlying said organic luminescent layer, wherein a first resonator is provided between the reflector of said metal layer and said second half-mirror, and a second resonator is provided between said reflector and said first half-mirror.

5. An organic luminescent device with a multiplex structure according to claim 1 or 2, including both said buffer layer and said second half-mirror layer, said buffer layer being sandwiched between the first half-mirror layer and the second half-mirror layer and the organic luminescent layer overlying the second half-mirror layer, resonators respectively being formed between said reflector and the first half-mirror layer, and between said reflector and the second half-mirror layer.

6. An organic luminescent device with a multiplex structure according to claim 1 or 2, including said second half-mirror layer, between said organic luminescent layer and said first half-mirror layer, such that resonators are respectively provided between said reflector and said first half-mirror layer, and between said reflector and said second half-mirror layer.

7. An organic luminescent device with a multiplex structure according to any one of claims 1, 2, 3 and 4, wherein said substrate is a transparent substrate.

8. An organic luminescent device with a multiplex structure according to claim 3 or 4, wherein said buffer layer varies an optical path length of light emitted by the organic luminescent layer response to signals from an external unit.

9. An organic luminescent device with a multiplex structure according to claim 8, wherein said buffer layer includes a sandwich of a layer of liquid crystal between transparent electrodes, provided between the first half-mirror and the second half-mirror.

* * * * *